United States Patent
Jackson

(10) Patent No.: US 9,100,033 B2
(45) Date of Patent: Aug. 4, 2015

(54) SYSTEMS AND METHODS FOR USING A DIGITAL POWER AMPLIFIER CONTROLLER (DPAC) HAVING FOWARD-LOOP CORRECTION AND FEEDBACK-LOOP CORRECTION

(71) Applicant: MOTOROLA SOLUTIONS, INC, Schaumburg, IL (US)

(72) Inventor: Eric L Jackson, Hoffman Estates, IL (US)

(73) Assignee: Motorola Solutions, Inc., Schaumburg, IL (US)

(*) Notice: Subject to any disclaimer, the term of this patent is extended or adjusted under 35 U.S.C. 154(b) by 19 days.

(21) Appl. No.: 14/137,431

(22) Filed: Dec. 20, 2013

(65) Prior Publication Data

US 2015/0180497 A1    Jun. 25, 2015

(51) Int. Cl.

| | | |
|---|---|---|
| *H03G 3/30* | (2006.01) | |
| *H03M 1/08* | (2006.01) | |
| *H03F 1/02* | (2006.01) | |
| *H03F 3/21* | (2006.01) | |
| *H03F 3/19* | (2006.01) | |
| *H04B 17/00* | (2015.01) | |

(52) U.S. Cl.
CPC ............. *H03M 1/0845* (2013.01); *H03F 1/02* (2013.01); *H03F 3/19* (2013.01); *H03F 3/21* (2013.01); *H04B 17/001* (2013.01); *H03F 2200/451* (2013.01); *H03F 2200/465* (2013.01)

(58) Field of Classification Search
CPC ...................................................... H03G 3/30
USPC ......................................... 330/279, 285, 296
See application file for complete search history.

(56) References Cited

U.S. PATENT DOCUMENTS

| | | | |
|---|---|---|---|
| 5,091,919 A | 2/1992 | Kuisma | |
| 5,150,075 A | 9/1992 | Hietala et al. | |
| 5,990,738 A | 11/1999 | Wright et al. | |
| 6,191,653 B1 * | 2/2001 | Camp et al. | 330/129 |
| 6,353,360 B1 | 3/2002 | Hau et al. | |
| 6,553,212 B1 | 4/2003 | Wey | |
| 6,708,025 B2 * | 3/2004 | Iwata et al. | 455/234.1 |

(Continued)

FOREIGN PATENT DOCUMENTS

| | | |
|---|---|---|
| EP | 1001529 B1 | 12/2004 |
| EP | 1162733 B1 | 11/2008 |

(Continued)

*Primary Examiner* — Henry Choe
(74) *Attorney, Agent, or Firm* — Barbara R. Doutre; Steven A. May

(57) ABSTRACT

Disclosed herein are systems and methods for using a digital power amplifier controller (DPAC) having forward-loop correction and feedback-loop correction. In an embodiment, the DPAC receives, via an analog-to-digital converter (ADC), a digital power-measurement signal from a power sensor coupled to an output of a power amplifier. The DPAC adjusts (e.g., linearizes) the digital power-measurement signal using a measurement-correction function for the sensor, and uses the adjusted digital power-measurement signal to generate a digital feedback signal, which the DPAC uses to generate a digital power-control signal that reflects a desired power level at the output of the power amplifier. The DPAC adjusts (e.g., linearizes) the digital power-control signal using a control-correction function for the power amplifier, and outputs the adjusted digital power-control signal via a digital-to-analog converter (DAC) to a power-control node of the power amplifier.

12 Claims, 6 Drawing Sheets

(56) References Cited

U.S. PATENT DOCUMENTS

| | | |
|---|---|---|
| 6,785,342 B1 | 8/2004 | Isaksen et al. |
| 6,788,138 B2 * | 9/2004 | Suzuki .................... 330/129 |
| 6,801,784 B1 | 10/2004 | Rozenblit et al. |
| 7,058,369 B1 | 6/2006 | Wright et al. |
| 7,148,749 B2 * | 12/2006 | Rahman et al. ........... 330/279 |
| 7,295,073 B2 * | 11/2007 | Hsieh et al. .............. 330/279 |
| 7,486,939 B2 | 2/2009 | Porco et al. |
| 7,498,882 B2 * | 3/2009 | Dally et al. .............. 330/279 |
| 7,555,275 B2 | 6/2009 | Lang |
| 7,904,033 B1 | 3/2011 | Wright et al. |
| 8,064,852 B2 * | 11/2011 | Pennec .................... 455/126 |
| 8,928,403 B2 * | 1/2015 | Bartram ................... 330/136 |
| 2003/0058959 A1 | 3/2003 | Rafie et al. |
| 2003/0184374 A1 | 10/2003 | Huang et al. |
| 2007/0190952 A1 * | 8/2007 | Waheed et al. ........... 455/114.3 |
| 2007/0207749 A1 | 9/2007 | Rozenblit et al. |
| 2008/0129379 A1 | 6/2008 | Copeland |
| 2009/0074106 A1 | 3/2009 | See et al. |
| 2014/0057684 A1 * | 2/2014 | Khlat ...................... 455/574 |

FOREIGN PATENT DOCUMENTS

| | | |
|---|---|---|
| WO | 0105026 A1 | 1/2001 |
| WO | 0129963 A1 | 4/2001 |

* cited by examiner

SYSTEMS AND METHODS FOR USING A DIGITAL POWER AMPLIFIER CONTROLLER (DPAC) HAVING FOWARD-LOOP CORRECTION AND FEEDBACK-LOOP CORRECTION

BACKGROUND OF THE INVENTION

In general, signal processing refers to techniques and processes by which analog and digital signals are created, transmitted, received, and interpreted, among other functions. In many instances, the signals are electromagnetic signals that are processed using various electrical devices and circuits, some of which are known as transmitters, others of which are known as receivers. When the signals that are being transmitted and/or received are radio-frequency (RF) signals, the transmitters and receivers are known as RF transmitters and RF receivers.

In the context of a given transmitter, which may be part of a wireless communication device such as a mobile station, an access terminal, a cellular phone, and the like, it is often the case that a main controller of the device sends to the transmitter via internal circuit connections a digital signal for the transmitter to then process (e.g., modulate) and wirelessly transmit to a receiver, such as a base station for example. The output of the transmitter, then, is typically a signal onto which the digital signal from the main controller has been modulated. In the case of a type of modulation known in the art as amplitude modulation (AM), and in the case of wireless communications using a format known as time-division multiple access (TDMA), as examples, the digital signal from the controller is expressed in the signal emitted from the transmitter as a changing amplitude, which is sometimes referred to in the art as a changing output power envelope of the emitted RF signal.

A transmitter that is performing well emits an output signal having a changing output power envelope that is a close replica of the digital signal sent from the main controller to the transmitter. Some challenges to achieving a close replica that are faced by those in the art include system components (such as power amplifiers, specifically the output-power control thereof, and the like) and sensors (such as diodes and the like) exhibiting non-linear behavior, as well as the potentially distorting effects of phenomena such as changes in temperature and changes in frequency in a given power amplifier.

BRIEF DESCRIPTION OF THE FIGURES

The accompanying figures, where like reference numerals refer to identical or functionally similar elements, together with the detailed description below, are incorporated into and form part of the specification, and serve to further illustrate embodiments of the following claims, and explain various principles and advantages of those embodiments.

Figure 1:
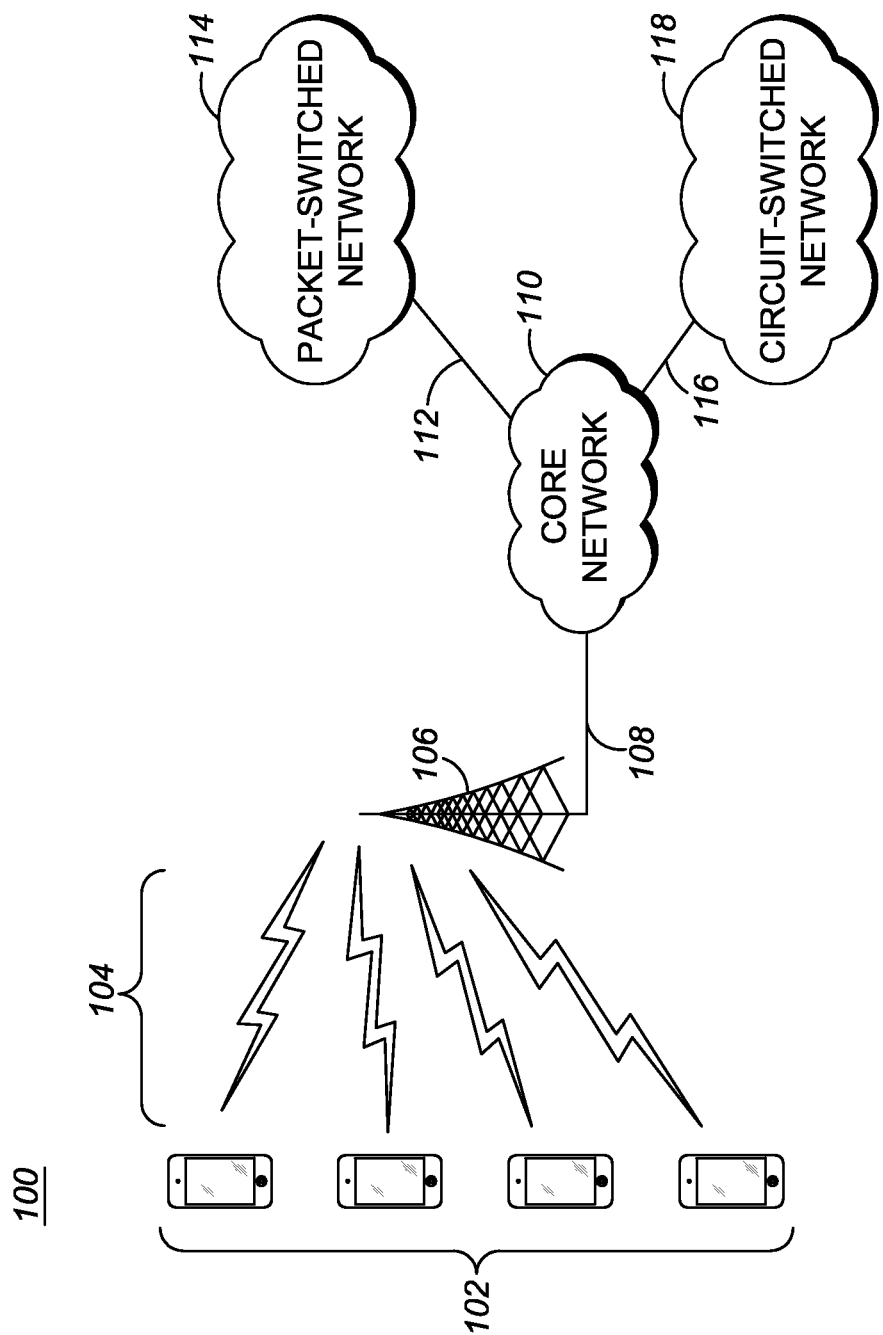
FIG. 1 depicts aspects of an example communication system in which at least one embodiment could be implemented.

Those having skill in the relevant art will appreciate that elements in the figures are illustrated for simplicity and clarity, and have not necessarily been drawn to scale. For example, the dimensions of some of the elements in the figures may be exaggerated relative to other elements to help to improve understanding of various embodiments. Furthermore, the apparatus and method components have been represented where appropriate by conventional symbols in the figures, showing only those specific details that are pertinent to understanding the disclosed embodiments so as not to obscure the disclosure with details that will be readily apparent to those having skill in the relevant art having the benefit of this description.

DETAILED DESCRIPTION

Disclosed herein are systems and methods for using a digital power amplifier controller (DPAC) having forward-loop correction and feedback-loop correction. One embodiment takes the form of a method carried out by a DPAC that includes a digital measurement-correction module (for feedback-loop correction) and a digital control-correction module (for forward-loop correction). The method includes receiving, via an analog-to-digital converter (ADC), from a power-level sensor coupled to a signal-output node of a power amplifier, a digital power-measurement signal with respect to an output signal of the power amplifier. The method also includes generating an adjusted digital power-measurement signal at least in part by using the digital measurement-correction module to apply a measurement-correction function for the power-level sensor to the digital power-measurement signal. The method also includes generating a digital feedback signal based at least in part on the adjusted digital power-measurement signal. The method also includes generating, based at least in part on the digital feedback signal, a digital power-control signal that reflects a desired power level at the signal-output node of the power amplifier. The method also includes generating an adjusted digital power-control signal at least in part by using the digital control-correction module to apply a control-correction function for the power amplifier to the digital power-control signal, and outputting the adjusted digital power-control signal via a digital-to-analog converter (DAC) to a power-control node of the power amplifier.

One embodiment takes the form of a system that includes a power amplifier that has a signal-input node, a signal-output node via which the power amplifier outputs an output signal, and a power-control node. The system also includes a power-level sensor that is coupled to the signal-output node of the power amplifier. The system also includes an ADC and a DAC. The system further includes a DPAC that includes a digital measurement-correction module and a digital control-correction module, and that is configured for carrying out a set of functions that includes the functions listed above in connection with the example method embodiment.

One embodiment takes the form of a DPAC that includes a digital measurement-correction module configured for receiving, via an ADC, from a power-level sensor coupled to a signal-output node of a power amplifier, a digital power-measurement signal with respect to an output signal of the power amplifier, and further configured for generating an adjusted digital power-measurement signal at least in part by applying a measurement-correction function for the power-level sensor to the digital power-measurement signal. The DPAC also includes a selector module configured for generating a digital feedback signal based at least in part on the adjusted digital power-measurement signal. The DPAC also includes an iterator module configured for generating a digital power-control signal based at least in part on the digital feedback signal, the digital power-control signal reflecting a desired power level at the signal-output node of the power amplifier. The DPAC also includes a digital control-correction module configured for generating an adjusted digital power-control signal at least in part by applying a control-correction function for the power amplifier to the digital power-control signal, and further configured for outputting the adjusted digital power-control signal via a DAC to a power-control node of the power amplifier.

In at least one embodiment, the power-level sensor exhibits a characteristic nonlinear power-measurement response, and the measurement-correction function for the power-level sensor includes a post-distortion function to correct for the characteristic nonlinear power-measurement response exhibited by the power-level sensor. In at least one embodiment, the power amplifier exhibits a characteristic nonlinear power-control response, and the control-correction function for the power amplifier includes a pre-distortion function to correct for the characteristic nonlinear power-control response exhibited by the power amplifier.

In at least one embodiment, generating the digital feedback signal based at least in part on the adjusted digital power-measurement signal involves using the adjusted digital power-measurement signal as the digital feedback signal.

In at least one embodiment, generating the digital feedback signal based at least in part on the adjusted digital power-measurement signal involves generating the digital feedback signal based at least in part on the adjusted digital power-measurement signal and at least in part on the digital power-control signal.

In at least one embodiment, generating the digital feedback signal based at least in part on the adjusted digital power-measurement signal involves detecting an invalid condition for the digital power-measurement signal used in generating the adjusted digital power-measurement signal, and responsively using the digital power-control signal as the digital feedback signal. In at least one such embodiment, generating the digital feedback signal based at least in part on the adjusted digital power-measurement signal further involves detecting a transition from the invalid condition to a valid condition for the digital power-measurement signal used in generating the adjusted digital power-measurement signal, and responsively generating the digital feedback signal based at least in part on the adjusted digital power-measurement signal and at least in part on the digital power-control signal. In at least one such embodiment, this involves combining the two signals according to a ratio of the adjusted digital power-measurement signal to the digital power-control signal, and further involves increasing the ratio between an initial value and a maximum value.

In at least one embodiment, generating the digital power-control signal based at least in part on the digital feedback signal involves generating the digital power-control signal based at least in part on the digital feedback signal and at least in part on a digital power-reference signal. In at least one such embodiment, the digital power-reference signal implements a power-ramping profile that provides for a transition period followed by a leveling period, the transition period providing for a rapid rate of increase of the desired power level at the signal-output node of the power amplifier, the leveling period providing for decreasing the rate of increase as the desired power level approaches a post-ramping target power level.

In at least one embodiment, generating the digital power-control signal based at least in part on the digital feedback signal and at least in part on the digital power-reference signal involves (i) a subtraction feedback comparator receiving as inputs the digital feedback signal and the digital power-reference signal, and generating as an output a digital difference-based error signal based at least in part on the digital feedback signal and at least in part on the digital power-reference signal, and further involves (ii) an aggregating adder receiving as inputs (a) the digital difference-based error signal from the subtraction feedback comparator and (b) a previous digital power-control signal, and generating as an output the digital power-control signal based at least in part on the digital difference-based error signal and at least in part on the previous digital power-control signal.

In at least one embodiment, generating the digital power-control signal based at least in part on the digital feedback signal and at least in part on the digital power-reference signal involves (i) a division feedback comparator receiving as inputs the digital feedback signal and the digital power-reference signal, and generating as an output a digital quotient-based error signal based at least in part on the digital feedback signal and at least in part on the digital power-reference signal, and further involves (ii) an aggregating multiplier receiving as inputs (a) the digital quotient-based error signal from the division feedback comparator and (b) a previous digital power-control signal, and generating as an output the digital power-control signal based at least in part on the digital quotient-based error signal and at least in part on the previous digital power-control signal.

In at least one embodiment, the DPAC that is described in connection with the present systems and methods (i.e., the present DPAC systems and DPAC methods) makes use of a digital signal processing (DSP) technique that provides closed-loop, feedback control of a non-linear power amplifier, so as to maintain and regulate precise output power even when operating in rugged environments that may involve large changes of temperature and what is known in the art as voltage standing wave ratio (VSWR). The present DPAC systems and DPAC methods work well in both standard analog and digital FM systems, as well as in connection with what are known in the art as non-constant-envelope applications such as TDMA and AM. As compared with traditional and complex analog approaches to amplifier power control, the present DPAC systems and DPAC methods result in improved performance, increased flexibility, and lowered costs.

In at least one embodiment, the present DPAC systems and DPAC methods employ pre-distortion techniques and post-distortion techniques for calibrating the control portion (in the forward arm) and the measurement portion (in the feedback arm), respectively, of the power-control loop. In such embodiments, pre-distortion is used for the power amplifier (and in particular for controlling the power output of the power amplifier) (and/or for one or more other highly non-linear elements) in the forward arm of the loop at least in part to assist in maintaining stability. Furthermore, in such embodiments, post-distortion is used in the feedback arm of the loop, including in connection with the detector circuit, in an effort to achieve precise (dynamic and steady-state) accuracy of the output power. In at least one embodiment, high-speed pre-distortion and post-distortion automated approaches are used during fabrication and testing to populate input/output tables in connection with the control-correction and measurement-correction functions, respectively, that are described below. And it is further noted that either or both of (i) the control-correction function for the power amplifier that is applied in at least one embodiment by the digital control-correction module and (ii) the measurement-correction function for the power-level sensor that is applied in at least one embodiment by the digital measurement-correction module could be linearization functions.

As is further described below in connection with at least FIG. 4, in at least one embodiment, the present DPAC systems and DPAC methods employ a traditional negative feedback system (NFS). In other embodiments, as is further described below in connection with at least FIG. 5, the present DPAC systems and DPAC methods employ a new and non-obvious approach that may be referred to as a Single-Cycle Compensated System (SCCS), which involves correcting the rate at which the output power of the amplifier changes as opposed to the power difference that is corrected for in a traditional NFS, and as a result tracks faster than a traditional NFS-based implementation. Moreover, the present DPAC systems and DPAC methods employ fast, yet smooth ramping profiles in order to minimize what is known in the art as splatter in adjacent channels. Furthermore, the present DPAC systems and DPAC methods employ an opened-to-closed-loop detection algorithm to facilitate smooth transitions during initial ramp-up and final ramp-down phases. And the present DPAC systems and DPAC methods include one or more additional aspects and/or features in various different embodiments, as is further described herein.

Moreover, it is noted that various elements of the described embodiments are referred to as modules (that perform (i.e., carry out) various functions described herein). Each given module includes or at least has access to any necessary hardware (e.g., one or more processors, one or more microchips, one or more microprocessors, one or more microcontrollers, one or more application-specific integrated circuits (ASICs), one or more field programmable gate arrays (FPGAs), one or more memory devices, and/or one or more of any other type or types of devices and/or components deemed suitable by those of skill in the relevant art in a given context and/or for a given implementation. Each given module also includes or at least has access to any necessary instructions executable for carrying out the one or more functions described as being carried out by the given module, where those instructions could take the form of or at least include hardware (i.e., hardwired) instructions, firmware instructions, software instructions, and/or the like, stored in any non-transitory computer-readable medium deemed suitable by those of skill in the relevant art.

Turning now to the figures, FIG. 1 depicts aspects of an example communication system in which at least one embodiment could be implemented. In particular, FIG. 1 depicts a communication system 100 as including a plurality of wireless communication devices 102, an air interface 104, a base station 106, a communication link 108, a core network 110, a communication link 112, a packet-switched network 114, a communication link 116, and a circuit-switched network 118. This arrangement is provided by way of example only, as many other suitable arrangements could be used in various implementations.

Each wireless communication device 102 may take the form of or include a device such as a mobile station, an access terminal, a cellular phone, a smartphone, and/or any other type of wireless communication device suitably configured and programmed for carrying out the functions described herein. The devices 102 communicate over the air interface 104 with the base station 106, and may do so using any wireless-communication technology, approach, and/or protocol deemed suitable for a given implementation. Some representative examples include wireless communication using AM and TDMA, though numerous examples could be listed.

Furthermore, while one base station 106 is shown for illustration, certainly multiple base stations could be deployed in a given implementation. Each of the communication links 108, 112, and 116 could employ any combination of wired and/or wireless communication deemed suitable for a given implementation. Core network 110 may carry out functions such as subscriber access control and mobility management, among many other possible functions, and may also provide network access to one or more signaling and/or transport packet-switched networks 114 (e.g., the Internet) and/or one or more signaling and/or transport circuit-switched networks 116 (e.g., the public switched telephone network (PSTN)).

Figure 2:
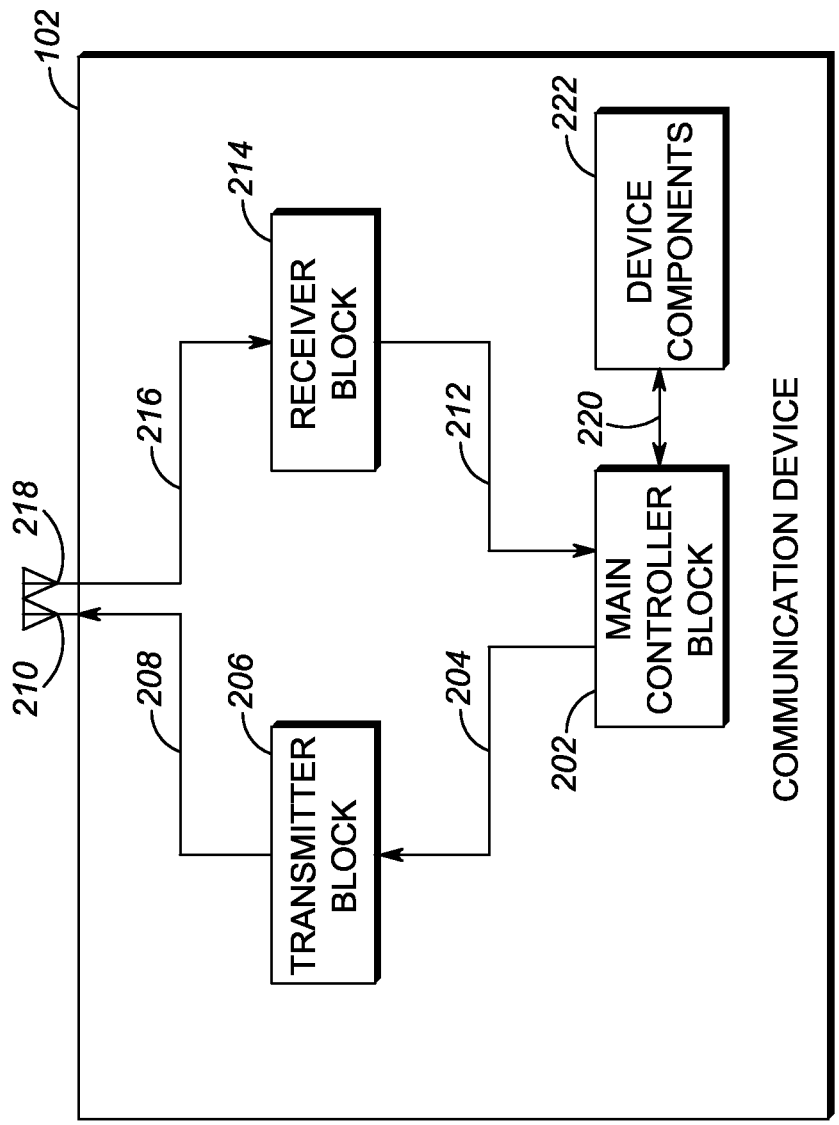
FIG. 2 depicts aspects of an example communication device in which at least one embodiment could be implemented.

FIG. 2 depicts aspects of an example communication device in which at least one embodiment could be implemented. In particular, FIG. 2 depicts an example wireless communication device 102 from FIG. 1 as including a main controller block 202, a communication link 204, a transmitter block 206, a communication link 208, a transmitter antenna component 210, a communication link 212, a receiver block 214, a communication link 216, a receiver antenna component 218, a communication link 220, and a device components block 222.

Each of the blocks 202, 206, 214, and 222 takes the form of or at least includes suitable hardware arranged and programmed to carry out the associated function. And two or more of these blocks could be combined or distributed in ways other than that shown in FIG. 2, as is known in the art. Main controller block 202 may include one or more processors such as digital microprocessors, dedicated digital signal processors (DSPs), and the like, as well as any suitable form of non-transitory data storage such as memory, cache memory, flash memory, disk storage, and the like, and further may contain instructions executable by the one or more processors for carrying out one or more of the functions described herein.

Transmitter block 206 may include any hardware suitable for carrying out a transmitter function for a wireless communication device, and may also contain executable instructions and its own one or more processors for carrying out such instructions, including but not limited to the hardware, instructions, and processor components discussed in connection with the ensuing figures. Similarly, receiver block 214 may include any hardware suitable for carrying out a receiver function for a wireless communication device, and may also contain executable instructions and its own one or more processors for carrying out such instructions. The antenna components 210 and 218 may each take the form of or at least include any suitable components known to those of skill in the art, and in some embodiments are combined in a single antenna interface. Each of the communication links 204, 208, 212, 216, and 220 could take on any form deemed suitable by those of skill in the art, some representative examples including communication buses, wires, and the like.

In typical operation, main controller block 202 may send, by way of communication link 204, outbound data to transmitter block 206, which may then format (e.g., modulate) that outbound data on to an outbound signal, and then transmit that outbound signal to a receiver via communication link 208 and transmitter antenna component 210. Similarly, an inbound signal may be received via receiver antenna component 218 and communication link 216 into receiver block 214, which may then format (e.g., demodulate) that inbound signal into inbound data, and then send, by way of communication link 212, that inbound data to main controller block 202. Main controller block 202 may interact via communication link 220 with other device components 222, which may include components such as a user interface, additional data storage, other processing resources, and/or any other device components deemed suitable by those of skill in the art in a given context.

Figure 3:
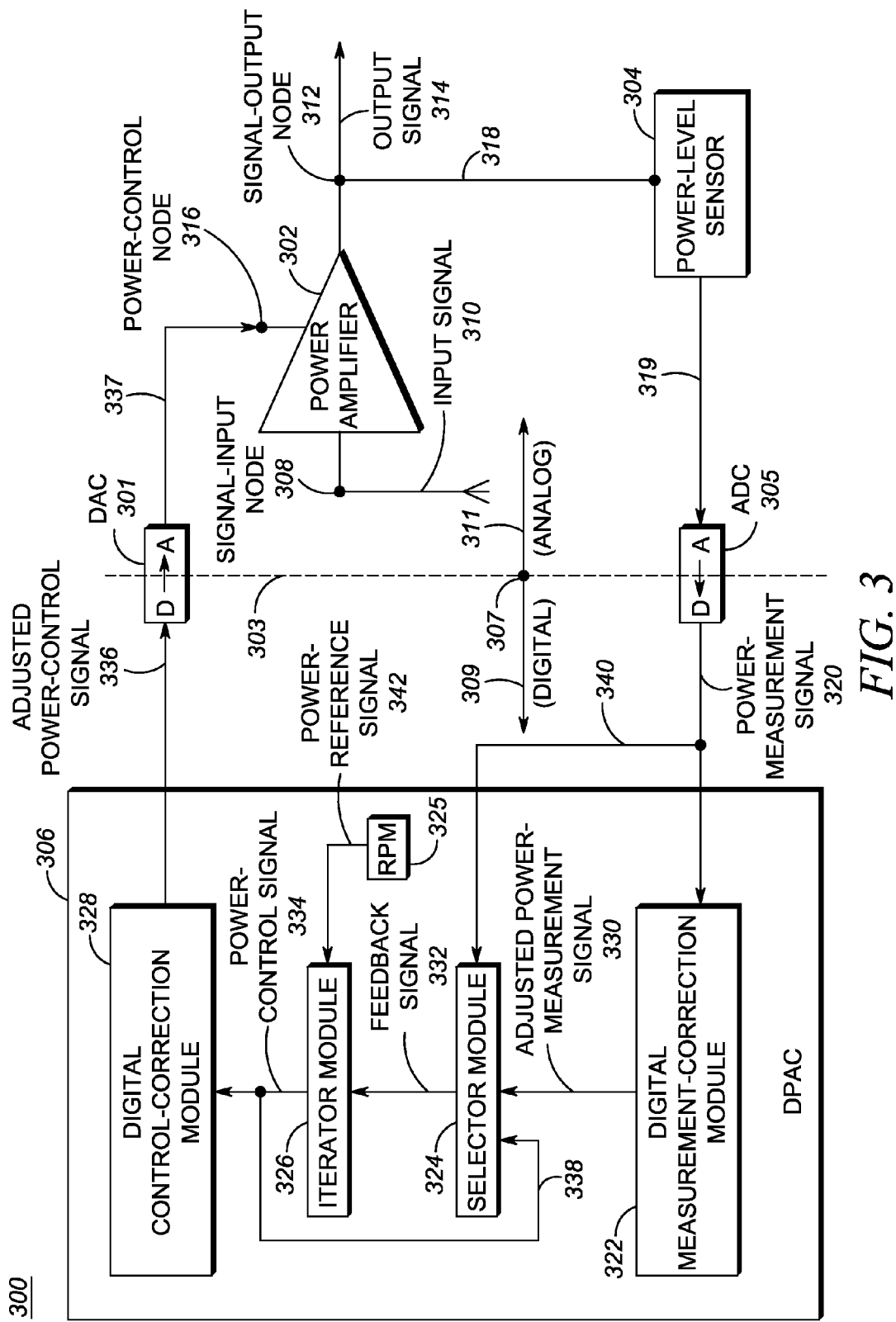
FIG. 3 depicts aspects of an example digital controller in accordance with at least one embodiment, as part of an example system in accordance with at least one embodiment.

FIG. 3 depicts aspects of an example digital controller in accordance with at least one embodiment, as part of an example system in accordance with at least one embodiment. FIG. 3 depicts a system 300 that could be implemented as part of transmitter block 206 of FIG. 2. One embodiment takes the form of the system 300, which could also be referred to as the DPAC system 300, and which includes a power amplifier 302, a power-level sensor 304, an ADC 305, a DAC 301, and what is referred to herein as a DPAC 306. One embodiment takes the form of a DPAC such as the DPAC 306.

In various different embodiments, the DPAC 306 includes one or both of the ADC 305 and the DAC 301, though those latter two elements are depicted separately in FIG. 3 to clarify and emphasize the "border" or "divide" between the digital side 309 of the DPAC system 300 and the analog side 311 of the DPAC system 300. The arrows 309 and 311, respectively indicating the digital and analog sides of the DPAC system 300, are both shown in FIG. 3 as both originating from a point 307 on a dashed line 303 that demarcates the digital side 309 from the analog side 311. The digital side 309 (e.g., the DPAC 306) may operate at a digital-clock speed (e.g., 50 kHz) deemed suitable by those of skill in the art for a given implementation.

Either or both of the DAC 301 and the ADC 305 may be realized in a given implementation using any suitable component or combination of components known to those of skill in the relevant art. As a general matter, the signals on the digital side 309 of the DPAC system 300 (i.e., signals 320, 330, 332, 334, 336, 338, 340, and 342) are digital signals, while the signals on the analog side 311 of the DPAC system 300 (i.e., signals 310, 314, 318, 319, and 337) are analog signals.

Power amplifier 302 may be any suitable power amplifier known to those of skill in the art, and in the depicted example has an RF signal-input node 308 via which power amplifier 302 receives an RF input signal 310. Power amplifier 302 also has a signal-output node 312 via which power amplifier 302 outputs an output signal 314. In at least one embodiment, signal-output node 312 takes the form of or at least includes a forward directional coupler. Furthermore, power amplifier 302 also has a power-control node 316 via which power amplifier 302 receives power-control signals such as the signal 337, which is an analog control signal produced by the DAC 301 from an adjusted digital power-control signal 336, which is discussed below.

Power-level sensor 304 may be any suitable power-level sensor known to those of skill in the art. In at least one embodiment, power-level sensor 304 takes the form of or at least includes a diode. Power-level sensor 304 is coupled by connection 318 to signal-output node 312, at which power-level sensor 304 measures a power level of output signal 314. Power-level sensor 304 outputs the result of this power-level measurement as an analog measurement signal 319, which is converted to a digital power-level measurement signal 320 by the ADC 305. The measurement signal 319/320 may take the form of a low-scaled, highly non-linear, though monotonic representation of the output signal 314 of the power amplifier 302.

The DPAC 306 may take the form of or include any suitable digital-logic-capable circuit components known to and deemed suitable for a given implementation by those of skill in the relevant art. In various embodiments, the DPAC 306 may be implemented by one or more generic or specialized processors (or "processing devices"), that is, digital-logic-capable devices, such as microprocessors, digital signal processors, microcontrollers, application-specific integrated circuits (ASICs), field programmable gate arrays (FPGAs), and one or more memory devices that store program instructions (including both software and firmware) that, when executed by one or more processors, implement the functions and modules of the DPAC described herein.

As depicted in FIG. 3, the DPAC 306 includes a digital measurement-correction module 322, a selector module 324, a ramp profiler module (RPM) 325, an iterator module 326, and a digital control-correction module 328.

The digital measurement-correction module 322 receives the digital power-measurement signal 320 from the power-level sensor 304 by way of the ADC 305, generates an adjusted digital power-measurement signal 330 based at least in part on the digital power-measurement signal 320, and outputs the adjusted digital power-measurement signal 330 to the selector module 324. In at least one embodiment, the digital measurement-correction module 322 generates the adjusted digital power-measurement signal 330 by applying a measurement-correction function (e.g., a linearization function) to the digital power-measurement signal 320. In at least one embodiment, this function is implemented using a stored input/output lookup table that was populated in advance, perhaps at the time of the fabrication and/or manufacture of the DPAC 306 and/or the DPAC system 300 as a whole.

The selector module 324 receives the adjusted digital power-measurement signal 330 from the digital measurement-correction module 322, generates a digital feedback signal 332 based at least in part on the adjusted digital power-measurement signal 330, and outputs that generated digital feedback signal 332 to the iterator module 326.

The iterator module 326 receives the digital feedback signal 332 from the selector module 324, generates a digital power-control signal 334 based at least in part on the digital feedback signal 332, and outputs that generated digital power-control signal 334 to the digital control-correction module 328. That generated digital power-control signal 334 reflects a desired power level at the signal-output node 312 of the power amplifier 302.

Figure 4:
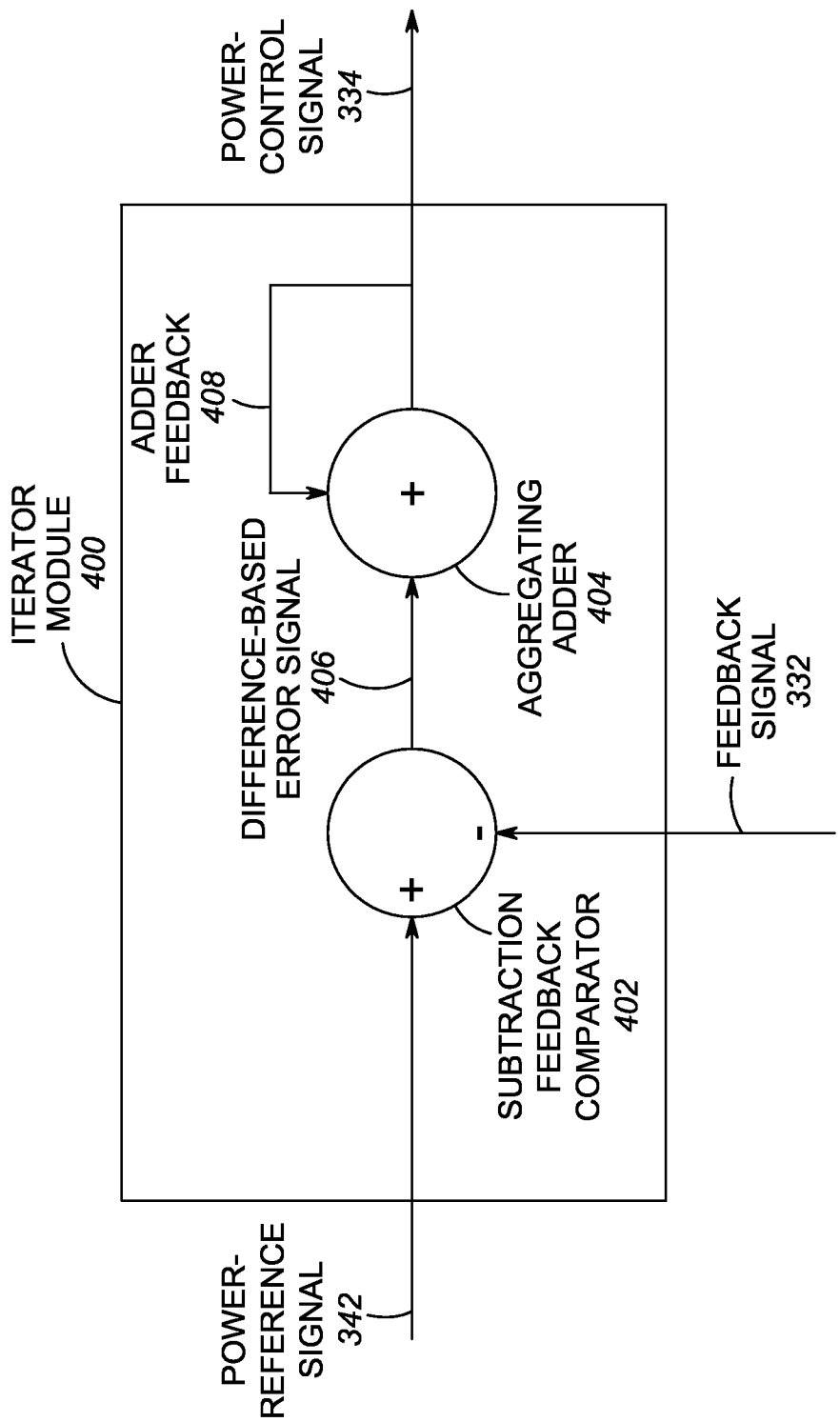
FIG. 4 depicts aspects of a first example iterator module used in connection with at least one embodiment.
Figure 5:
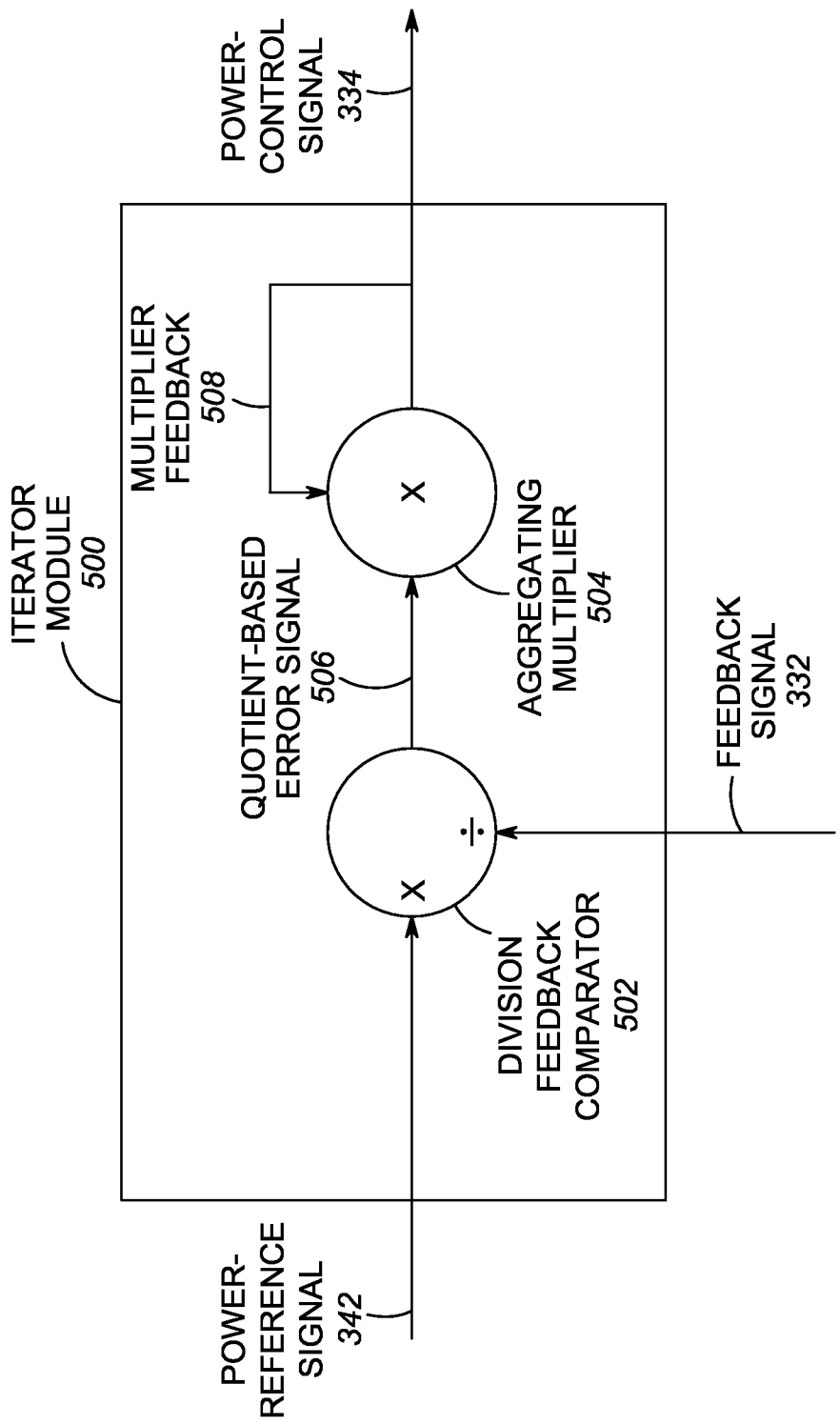
FIG. 5 depicts aspects of a second example iterator module used in connection with at least one embodiment.

The iterator module 326 may be implemented in a number of different ways, two examples of which are depicted in FIGS. 4 and 5.

FIG. 4 depicts aspects of a first example iterator module used in connection with at least one embodiment. As shown in FIG. 4, an iterator module 400, which may be used in place of the iterator module 326 of FIG. 3, includes a subtraction feedback comparator 402 and an aggregating adder 404. Consistent with the iterator module 326 of FIG. 3, the iterator module 400 of FIG. 4 takes as inputs the digital feedback signal 332 and the digital power-reference signal 342, and generates as an output the digital power-control signal 334. In the embodiment depicted in FIG. 4, it is the subtraction feedback comparator 402 that in particular receives the digital feedback signal 332 and the digital power-reference signal 342, and that in turn responsively generates a digital difference-based error signal 406, which represents the difference, if any, between the digital power-reference signal 342 and the digital feedback signal 332. The digital difference-based error signal 406 is then received by the aggregating adder 404, which adds the digital difference-based error signal 406 to any already stored value (which may be initialized to a default value such as zero) (i.e., a previous digital power-control signal), and then recursively stores the new value (as shown at adder feedback 408) while also outputting that new value as the digital power-control signal 334.

FIG. 5 depicts aspects of a second example iterator module used in connection with at least one embodiment. As shown in FIG. 5, an iterator module 500, which may be used in place of the iterator module 326 of FIG. 3, includes a division feedback comparator 502 and an aggregating multiplier 504. Consistent with the iterator module 326 of FIG. 3, the iterator module 500 of FIG. 5 takes as inputs the digital feedback signal 332 and the digital power-reference signal 342, and generates as an output the digital power-control signal 334. In the embodiment depicted in FIG. 5, it is the division feedback comparator 502 that in particular receives the digital feedback signal 332 and the digital power-reference signal 342, and that in turn responsively generates a digital quotient-based error signal 506, which represents the quotient of the digital power-reference signal 342 and the digital feedback signal 332. The digital quotient-based error signal 506 is then received by the aggregating multiplier 504, which multiplies the digital quotient-based error signal 506 with any already stored value (which may be initialized to a default value such as one) (i.e., a previous digital power-control signal), and then recursively stores the new value (as shown at multiplier feedback 508) while also outputting that new value as the digital power-control signal 334.

Returning now to FIG. 3, as is further explained below, and as is depicted at 338, the selector module 324 in at least one embodiment receives the digital power-control signal 334 as an input (in addition to also receiving the adjusted digital power-measurement signal 330 as an input, as described above). Moreover, as also explained below, and as is depicted at 340, the selector module 324 in at least one embodiment also receives the digital power-measurement signal 320 as a control input. As is also explained below, and as is depicted in FIG. 3, the iterator module 326 in at least one embodiment receives a digital power-reference signal 342 from the RPM 325.

The digital control-correction module 328 receives the digital power-control signal 334 from the iterator module 326, generates the digital adjusted power-control signal 336 based at least in part on the digital power-control signal 334, and outputs (via the DAC 301) the adjusted power-control signal 336, which is converted to the analog power-control signal 337 by the DAC 301 before being delivered to the power-control node 316 of the power amplifier 302. In at least one embodiment, the digital control-correction module 328 generates the adjusted digital power-control signal 336 by applying a control-correction function (e.g., a linearization function) to the digital power-control signal 334. In at least one embodiment, this function is implemented using a stored input/output lookup table that was populated in advance, perhaps at the time of the fabrication and/or manufacture of the DPAC 306 and/or the DPAC system 300 as a whole.

In the case of the power-level sensor 304 exhibiting a characteristic non-linear measurement response and the measurement-correction function being a linearization function, the digital measurement-correction module 322 enables the remaining components of the DPAC 306 to operate more simply and efficiently on linearized measurement data from the feedback loop. In the case of the power amplifier 302 exhibiting a characteristic non-linear power-control response and the control-correction function being a linearization function, the digital control-correction module 328 enables the remaining components of the DPAC 306 (i.e., those components between the digital measurement-correction module 322 and the digital control-correction module 328, including but not limited to the selector module 324, the RPM 325, and the iterator module 326) to operate more simply and efficiently on linearized measurement data. When both are the case, the simplicity and efficiency of the overall operation of both the DPAC 306 and the DPAC system as a whole are further enhanced.

Figure 6:
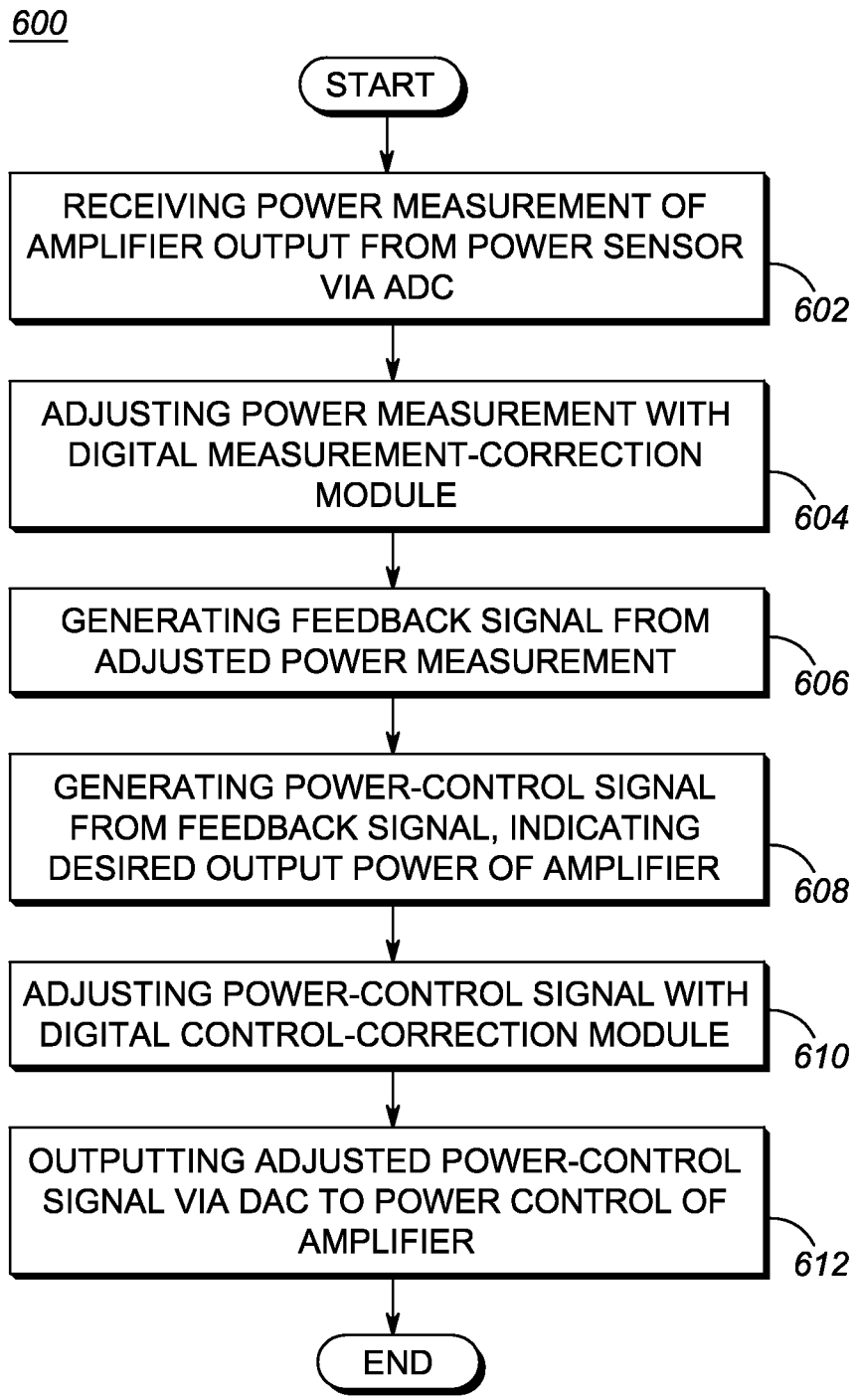
FIG. 6 depicts aspects of an example method in accordance with at least one embodiment.

FIG. 6 depicts aspects of an example method in accordance with at least one embodiment. In at least one embodiment, the DPAC 306 of FIG. 3 carries out the method 600 (which could also be referred to as the DPAC method 600).

The method 600 includes step 602, which is receiving, from the power-level sensor 304, the digital power-measurement signal 320 (as converted from the analog measurement signal 319 by the ADC 305), indicating the power level of the (analog) output signal 314 at signal-output node 312 of power amplifier 302, as measured by the power-level sensor 304 via the connection 318.

The method 600 also includes step 604, which is generating the adjusted digital power-measurement signal 330 at least in part by using the digital measurement-correction module 322 to apply a measurement-correction function for the power-level sensor 304 to the digital power-measurement signal 320. In at least one embodiment, the power-level sensor 304 exhibits a characteristic nonlinear power-measurement response, and the measurement-correction function includes a post-distortion function (perhaps calibrated at the time of fabrication and/or manufacture of the DPAC 306 and/or the DPAC system 300 as a whole) to correct for the characteristic nonlinear power-measurement response exhibited by the power-level sensor 304.

The method 600 also includes step 606, which is generating (using the selector module 324 in an embodiment) the digital feedback signal 332 based at least in part on the adjusted digital power-measurement signal 330. In at least one embodiment, step 606 involves using the adjusted digital power-measurement signal 330 as the digital feedback signal 332. In at least one embodiment, step 606 involves generating the digital feedback signal 332 based at least in part on the adjusted digital power-measurement signal 330 and at least in part on the digital power-control signal 334, which the selector module 324 receives at 338, as depicted in FIG. 3.

In at least one embodiment, step 606 involves detecting (via the connection depicted at 340 in FIG. 3) an invalid condition for the digital power-measurement signal 320 used in generating the adjusted digital power-measurement signal 330 (perhaps due to the actual power level at the signal-output node 312 not being within the valid operational range of the power-level sensor (e.g., diode) 304), and responsively using the digital power-control signal 334 (as received at 338 in FIG. 3) as the digital feedback signal 332. In at least one such embodiment, step 606 further involves detecting (again via the connection at 340) a transition from the invalid condition to a valid condition for the digital power-measurement signal 320 used in generating the adjusted digital power-measurement signal 330 (perhaps due to the actual power level at the signal-output node 312 moving into the valid operational range of the power-level sensor (e.g., diode) 304), and responsively generating the digital feedback signal 332 based at least in part on the adjusted digital power-measurement signal 330 and at least in part on the digital power-control signal 334. In at least one such embodiment, this involves combining the two signals according to a ratio of the adjusted digital power-measurement signal 330 to the digital power-control signal 334, and further involves increasing the ratio between an initial value and a maximum value, in order to smooth the transition from (i) using the digital power-control signal 334 as the digital feedback signal 332 to (ii) using the adjusted digital power-measurement signal 330 as the digital feedback signal 332.

The method 600 also includes step 608, which is generating (using the iterator module 326 in an embodiment) the digital power-control signal 334 based at least in part on the digital feedback signal 332, where that generated digital power-control signal 334 reflects a desired power level at the signal-output node 312 of the power amplifier 302.

In at least one embodiment, step 608 involves generating the digital power-control signal 334 based at least in part on the digital feedback signal 332 and at least in part on the digital power-reference signal 342. In at least one such embodiment, the digital power-reference signal 342 implements (at the direction of, e.g., the RPM 325) a power-ramping profile that provides for a transition period followed by a leveling period, in which the transition period provides for a rapid rate of increase of the desired power level at the signal-output node 312 of the power amplifier 302, and in which the leveling period provides for decreasing the rate of increase as the desired power level approaches a post-ramping target power level.

In at least one embodiment, generating the digital power-control signal 334 based at least in part on the digital feedback signal 332 and at least in part on the digital power-reference signal 342 involves (i) the subtraction feedback comparator 402 receiving as inputs the digital feedback signal 332 and the digital power-reference signal 342, and generating as an output the digital difference-based error signal 406 based at least in part on the digital feedback signal 332 and at least in part on the digital power-reference signal 342, and further involves (ii) the aggregating adder 404 receiving as inputs (a) the digital difference-based error signal 406 from the subtraction feedback comparator 402 and (b) a previous digital power-control signal, and generating as an output the digital power-control signal 334 based at least in part on digital difference-based error signal 406 and at least in part on the previous digital power-control signal.

In at least one embodiment, generating the digital power-control signal 334 based at least in part on the digital feedback signal 332 and at least in part on the digital power-reference signal 342 involves (i) the division feedback comparator 502 receiving as inputs the digital feedback signal 332 and the digital power-reference signal 342, and generating as an output a digital quotient-based error signal 506 based at least in part on the digital feedback signal 332 and at least in part on the digital power-reference signal 342, and further involves (ii) the aggregating multiplier 504 receiving as inputs (a) the digital quotient-based error signal 506 from the division feedback comparator 502 and (b) a previous digital power-control signal, and generating as an output the digital power-control signal 334 based at least in part on the digital quotient-based error signal 506 and at least in part on the previous digital power-control signal.

The method 600 also includes step 610, which is generating the adjusted digital power-control signal 336 at least in part by using the digital control-correction module 328 to apply a control-correction function for the power amplifier 302 to the digital power-control signal 334. In at least one embodiment, the power amplifier 302 exhibits a characteristic nonlinear power-control response, and the control-correction function includes a pre-distortion function (perhaps calibrated at the time of fabrication and/or manufacture of the DPAC 306 and/or the DPAC system 300 as a whole) to correct for the characteristic nonlinear power-control response exhibited by the power amplifier 302.

The method 600 also includes step 612, which is outputting the adjusted digital power-control signal 336 via the DAC 301 to the power-control node 316 of the power amplifier 302, where the DAC 301 converts the adjusted digital power-control signal 336 to the analog power-control signal 337 for delivery (i.e., transmission) to the power-control node 316 of the power amplifier 302.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method carried out by a digital power amplifier controller (DPAC), the DPAC comprising a digital measurement-correction module and a digital control-correction module, the method comprising:
   receiving, via an analog-to-digital converter (ADC), from a power-level sensor coupled to a signal-output node of a power amplifier, a digital power-measurement signal with respect to an output signal of the power amplifier;
   generating an adjusted digital power-measurement signal at least in part by using the digital measurement-correction module to apply a measurement-correction function for the power-level sensor to the digital power-measurement signal, wherein the power-level sensor exhibits a characteristic nonlinear power-measurement response, and wherein the measurement-correction function for the power-level sensor comprises a post-distortion function to correct for the characteristic nonlinear power-measurement response exhibited by the power-level sensor;
   generating a digital feedback signal based at least in part on the adjusted digital power-measurement signal;
   generating a digital power-control signal based at least in part on the digital feedback signal, the digital power-control signal reflecting a desired power level at the signal-output node of the power amplifier;
   generating an adjusted digital power-control signal at least in part by using the digital control-correction module to apply a control-correction function for the power amplifier to the digital power-control signal; and
   outputting the adjusted digital power-control signal via a digital-to-analog converter (DAC) to a power-control node of the power amplifier.

2. The method of claim 1, wherein generating the digital feedback signal based at least in part on the adjusted digital power-measurement signal comprises:
   using the adjusted digital power-measurement signal as the digital feedback signal.

3. The method of claim 1, wherein generating the digital feedback signal based at least in part on the adjusted digital power-measurement signal comprises:
   generating the digital feedback signal based at least in part on the adjusted digital power-measurement signal and at least in part on the digital power-control signal.

4. A method carried out by a digital power amplifier controller (DPAC), the DPAC comprising a digital measurement-correction module and a digital control-correction module, the method comprising:
   receiving, via an analog-to-digital converter (ADC), from a power-level sensor coupled to a signal-output node of a power amplifier, a digital power-measurement signal with respect to an output signal of the power amplifier;
   generating an adjusted digital power-measurement signal at least in part by using the digital measurement-correction module to apply a measurement-correction function for the power-level sensor to the digital power-measurement signal;
   generating a digital feedback signal based at least in part on the adjusted digital power-measurement signal;
   generating a digital power-control signal based at least in part on the digital feedback signal, the digital power-control signal reflecting a desired power level at the signal-output node of the power amplifier;
   generating an adjusted digital power-control signal at least in part by using the digital control-correction module to apply a control-correction function for the power amplifier to the digital power-control signal; and
   outputting the adjusted digital power-control signal via a digital-to-analog converter (DAC) to a power-control node of the power amplifier;
wherein generating the digital feedback signal based at least in part on the adjusted digital power-measurement signal comprises:
   detecting an invalid condition for the digital power-measurement signal used in generating the adjusted digital power-measurement signal; and
   detecting a transition from the invalid condition to a valid condition for the digital power-measurement signal used in generating the adjusted digital power-measurement signal; and
   responsively generating the digital feedback signal at least in part by combining the adjusted digital power-measurement signal and the digital power-control signal according to a ratio of the adjusted digital power-measurement signal to the digital power-control signal,
   the method further comprising:
   increasing the ratio between an initial value and a maximum value.

5. A method carried out by a digital power amplifier controller (DPAC), the DPAC comprising a digital measurement-correction module and a digital control-correction module, the method comprising:
   receiving, via an analog-to-digital converter (ADC), from a power-level sensor coupled to a signal-output node of a power amplifier, a digital power-measurement signal with respect to an output signal of the power amplifier;
   generating an adjusted digital power-measurement signal at least in part by using the digital measurement-correction module to apply a measurement-correction function for the power-level sensor to the digital power-measurement signal;
   generating a digital feedback signal based at least in part on the adjusted digital power-measurement signal;

generating a digital power-control signal based at least in part on the digital feedback signal, the digital power-control signal reflecting a desired power level at the signal-output node of the power amplifier;

generating an adjusted digital power-control signal at least in part by using the digital control-correction module to apply a control-correction function for the power amplifier to the digital power-control signal; and outputting the adjusted digital power-control signal via a digital-to-analog converter (DAC) to a power-control node of the power amplifier;

wherein generating the digital power-control signal based at least in part on the digital feedback signal comprises generating the digital power-control signal based at least in part on the digital feedback signal and at least in part on a digital power-reference signal by;

a subtraction feedback comparator receiving as inputs the digital feedback signal and the digital power-reference signal;

the subtraction feedback comparator generating as an output a digital difference-based error signal based at least in part on the digital feedback signal and at least in part on the digital power-reference signal;

an aggregating adder receiving as inputs (i) the digital difference-based error signal from the subtraction feedback comparator and (ii) a previous digital power-control signal; and the aggregating adder generating as an output the digital power-control signal based at least in part on the digital difference-based error signal and at least in part on the previous digital power-control signal.

6. A method carried out by a digital power amplifier controller (DPAC), the DPAC comprising a digital measurement-correction module and a digital control-correction module, the method comprising:

receiving, via an analog-to-digital converter (ADC), from a power-level sensor coupled to a signal-output node of a power amplifier, a digital power-measurement signal with respect to an output signal of the power amplifier;

generating an adjusted digital power-measurement signal at least in part by using the digital measurement-correction module to apply a measurement-correction function for the power-level sensor to the digital power-measurement signal;

generating a digital feedback signal based at least in part on the adjusted digital power-measurement signal;

generating a digital power-control signal based at least in part on the digital feedback signal, the digital power-control signal reflecting a desired power level at the signal-output node of the power amplifier;

generating an adjusted digital power-control signal at least in part by using the digital control-correction module to apply a control-correction function for the power amplifier to the digital power-control signal; and outputting the adjusted digital power-control signal via a digital-to-analog converter (DAC) to a power-control node of the power amplifier;

wherein generating the digital power-control signal based at least in part on the digital feedback signal comprises generating the digital power-control signal based at least in part on the digital feedback signal and at least in part on a digital power-reference signal;

wherein generating the digital power-control signal based at least in part on the digital feedback signal and at least in part on the digital power-reference signal comprises:

a division feedback comparator receiving as inputs the digital feedback signal and the digital power-reference signal;

the division feedback comparator generating as an output a digital quotient-based error signal based at least in part on the digital feedback signal and at least in part on the digital power-reference signal;

an aggregating multiplier receiving as inputs (i) the digital quotient-based error signal from the division feedback comparator and (ii) a previous digital power-control signal; and the aggregating multiplier generating as an output the digital power-control signal based at least in part on the digital quotient-based error signal and at least in part on the previous digital power-control signal.

7. A method carried out by a digital power amplifier controller (DPAC), the DPAC comprising a digital measurement-correction module and a digital control-correction module, the method comprising:

receiving, via an analog-to-digital converter (ADC), from a power-level sensor coupled to a signal-output node of a power amplifier, a digital power-measurement signal with respect to an output signal of the power amplifier;

generating an adjusted digital power-measurement signal at least in part by using the digital measurement-correction module to apply a measurement-correction function for the power-level sensor to the digital power-measurement signal;

generating a digital feedback signal based at least in part on the adjusted digital power-measurement signal;

generating a digital power-control signal based at least in part on the digital feedback signal, the digital power-control signal reflecting a desired power level at the signal-output node of the power amplifier;

generating an adjusted digital power-control signal at least in part by using the digital control-correction module to apply a control-correction function for the power amplifier to the digital power-control signal; and outputting the adjusted digital power-control signal via a digital-to-analog converter (DAC) to a power-control node of the power amplifier;

wherein generating the digital power-control signal based at least in part on the digital feedback signal comprises generating the digital power-control signal based at least in part on the digital feedback signal and at least in part on a digital power-reference signal;

wherein the digital power-reference signal implements a power-ramping profile that provides for a transition period followed by a leveling period, the transition period providing for a rapid rate of increase of the desired power level at the signal-output node of the power amplifier, the leveling period providing for decreasing the rate of increase as the desired power level approaches a post-ramping target power level.

8. A digital power amplifier controller (DPAC), the DPAC comprising:

a processor that is configured to implement:

a digital measurement-correction module that performs:

receiving, via an analog-to-digital converter (ADC), from a power-level sensor coupled to a signal-output node of a power amplifier, a digital power-measurement signal with respect to an output signal of the power amplifier; and generating an adjusted digital power-measurement signal at least in part by applying a measurement-correction function for the power-level sensor to the digital power-measurement signal;

a selector module that performs:
  generating a digital feedback signal based at least in part on the adjusted digital power-measurement signal;
an iterator module that performs:
  generating a digital power-control signal based at least in part on the digital feedback signal, the digital power-control signal reflecting a desired power level at the signal-output node of the power amplifier; and
a digital control-correction module that performs:
  generating an adjusted digital power-control signal at least in part by applying a control-correction function for the power amplifier to the digital power-control signal; and
  outputting the adjusted digital power-control signal via a digital-to-analog converter (DAC) to a power-control node of the power amplifier; and
wherein:
  the power-level sensor exhibits a characteristic nonlinear power-measurement response, and the measurement-correction function for the power-level sensor comprises a post-distortion function to correct for the characteristic nonlinear power-measurement response exhibited by the power-level sensor; and
  the power amplifier exhibits a characteristic nonlinear power-control response, and the control-correction function for the power amplifier comprises a pre-distortion function to correct for the characteristic nonlinear power-control response exhibited by the power amplifier.

9. The DPAC of claim 8, wherein generating the digital feedback signal based at least in part on the adjusted digital power-measurement signal comprises:
  using the adjusted digital power-measurement signal as the digital feedback signal.

10. The DPAC of claim 8, wherein generating the digital feedback signal based at least in part on the adjusted digital power-measurement signal comprises:
  generating the digital feedback signal based at least in part on the adjusted digital power-measurement signal and at least in part on the digital power-control signal.

11. A digital power amplifier controller (DPAC), the DPAC comprising:
  a processor that is configured to implement:
  a digital measurement-correction module that performs:
    receiving, via an analog-to-digital converter (ADC), from a power-level sensor coupled to a signal-output node of a power amplifier, a digital power-measurement signal with respect to an output signal of the power amplifier; and
    generating an adjusted digital power-measurement signal at least in part by applying a measurement-correction function for the power-level sensor to the digital power-measurement signal;
  a selector module that performs:
    generating a digital feedback signal based at least in part on the adjusted digital power-measurement signal;
  an iterator module that performs:
    generating a digital power-control signal based at least in part on the digital feedback signal, the digital power-control signal reflecting a desired power level at the signal-output node of the power amplifier; and
  a digital control-correction module that performs:
    generating an adjusted digital power-control signal at least in part by applying a control-correction function for the power amplifier to the digital power-control signal; and
    outputting the adjusted digital power-control signal via a digital-to-analog converter (DAC) to a power-control node of the power amplifier; and
wherein generating the digital feedback signal based at least in part on the adjusted digital power-measurement signal comprises:
  detecting an invalid condition for the digital power-measurement signal used in generating the adjusted digital power-measurement signal;
  detecting a transition from the invalid condition to a valid condition for the digital power-measurement signal used in generating the adjusted digital power-measurement signal; and
  responsively generating the digital feedback signal based at least in part on the adjusted digital power-measurement signal and at least in part on the digital power-control signal.

12. A digital power amplifier controller (DPAC), the DPAC comprising:
  a processor that is configured to implement:
  a digital measurement-correction module that performs:
    receiving, via an analog-to-digital converter (ADC), from a power-level sensor coupled to a signal-output node of a power amplifier, a digital power-measurement signal with respect to an output signal of the power amplifier; and
    generating an adjusted digital power-measurement signal at least in part by applying a measurement-correction function for the power-level sensor to the digital power-measurement signal;
  a selector module that performs:
    generating a digital feedback signal based at least in part on the adjusted digital power-measurement signal;
  an iterator module that performs:
    generating a digital power-control signal based at least in part on the digital feedback signal, the digital power-control signal reflecting a desired power level at the signal-output node of the power amplifier; and
  a digital control-correction module that performs:
    generating an adjusted digital power-control signal at least in part by applying a control-correction function for the power amplifier to the digital power-control signal;
    outputting the adjusted digital power-control signal via a digital-to-analog converter (DAC) to a power-control node of the power amplifier; and
wherein generating the digital power-control signal based at least in part on the digital feedback signal comprises generating the digital power-control signal based at least in part on the digital feedback signal and at least in part on a digital power-reference signal, wherein the digital power-reference signal implements a power-ramping profile that provides for a transition period followed by a leveling period, the transition period providing for a rapid rate of increase of the desired power level at the signal-output node of the power amplifier, the leveling period providing for decreasing the rate of increase as the desired power level approaches a post-ramping target power level.

* * * * *